(12) United States Patent
Ooi

(10) Patent No.: US 12,538,726 B2
(45) Date of Patent: Jan. 27, 2026

(54) METALLIZATION IN INTEGRATED CIRCUITS

(71) Applicant: TEXAS INSTRUMENTS INCORPORATED, Dallas, TX (US)

(72) Inventor: Frances Ooi, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 516 days.

(21) Appl. No.: 18/085,183

(22) Filed: Dec. 20, 2022

(65) Prior Publication Data

US 2023/0352311 A1 Nov. 2, 2023

Related U.S. Application Data

(60) Provisional application No. 63/335,965, filed on Apr. 28, 2022.

(51) Int. Cl.
| | | |
|---|---|---|
| *H01L 21/311* | (2006.01) | |
| *H01L 21/3065* | (2006.01) | |
| *H01L 21/768* | (2006.01) | |
| *H01L 23/532* | (2006.01) | |

(52) U.S. Cl.
CPC .... *H01L 21/31138* (2013.01); *H01L 21/3065* (2013.01); *H01L 21/76832* (2013.01); *H01L 23/53223* (2013.01); *H01L 23/53238* (2013.01)

(58) Field of Classification Search
CPC .................................................. H01L 21/31138
See application file for complete search history.

(56) References Cited

U.S. PATENT DOCUMENTS

| | | | | |
|---|---|---|---|---|
| 6,159,847 A | * | 12/2000 | Havemann | H01L 23/53223 257/E21.585 |
| 2003/0219912 A1 | * | 11/2003 | Chen | H01L 21/31138 257/E21.256 |
| 2005/0284573 A1 | * | 12/2005 | Egley | C23C 8/02 216/37 |
| 2007/0093071 A1 | * | 4/2007 | Verhaverbeke | H01L 21/67173 430/269 |
| 2009/0080124 A1 | * | 3/2009 | Yoshikawa | H10N 50/85 |
| 2011/0256483 A1 | * | 10/2011 | Kamata | C11D 7/5022 430/312 |

* cited by examiner

*Primary Examiner* — Erik Kielin

(74) *Attorney, Agent, or Firm* — Andrew R. Ralston; Frank D. Cimino

(57) ABSTRACT

Described examples include a method for forming an integrated circuit, the method including depositing a metal layer including aluminum and copper over a semiconductor substrate and forming a patterned photoresist layer over the metal layer. The method also including etching the metal layer to produce a patterned metal layer and ashing the patterned photoresist layer in a plasma provided in a process chamber sourced with a gas flow having an N2/O2 ratio of at least 15%.

13 Claims, 5 Drawing Sheets

METALLIZATION IN INTEGRATED CIRCUITS

CROSS-REFERENCE TO RELATED APPLICATIONS

This application claims the benefit under 35 U.S.C. § 119(e) to co-owned U.S. Provisional Patent Application Ser. No. 63/335,965, filed Apr. 28, 2022, which is hereby incorporated by reference in its entirety herein.

TECHNICAL FIELD

This relates generally metallization in integrated circuits, and more particularly to control of precipitates in metallization.

BACKGROUND

Aluminum interconnects have long been used in integrated circuits in part due to low material cost and relative ease of manufacturing. To reduce electromigration effect such as void and hillock formation, the aluminum is typically alloyed with a small amount of copper, typically 2-4 wt. %. But under some conditions copper may precipitate from patterned Al—Cu lines. If a copper precipitate connects between two lines, a conductive bridge, or short, may cause the completed integrated circuit to malfunction.

SUMMARY

In accordance with an example, a method for forming an integrated circuit includes depositing a metal layer including aluminum and copper over a semiconductor substrate and forming a patterned photoresist layer over the metal layer. The method also includes etching the metal layer to produce a patterned metal layer and ashing the patterned photoresist layer in a plasma provided in a process chamber sourced with a gas flow having an $N_2$—$O_2$ flow ratio of at least 15%.

In accordance with another example, a method for forming an integrated circuit includes providing a substrate, forming an insulating layer on the substrate, and depositing a first barrier layer on the insulating layer. The method also includes depositing a metal layer including aluminum and copper on the first barrier layer, depositing a second barrier layer on the metal layer, and forming a photoresist layer on the second barrier layer. The method also includes exposing the photoresist layer to light conforming to a desired pattern of the first barrier layer, the metal layer and the second barrier layer and removing portions of the photoresist layer on the second barrier layer corresponding to where the second barrier layer, the metal layer and the first barrier layer are to be removed. The method also includes etching the second barrier layer, the metal layer, and the first barrier layer to provide a patterned metal layer and ashing the photoresist layer in a plasma provided in a process chamber sourced with a gas flow having an N2-O2 flow ratio of at least 15%.

DETAILED DESCRIPTION

Figure 1:
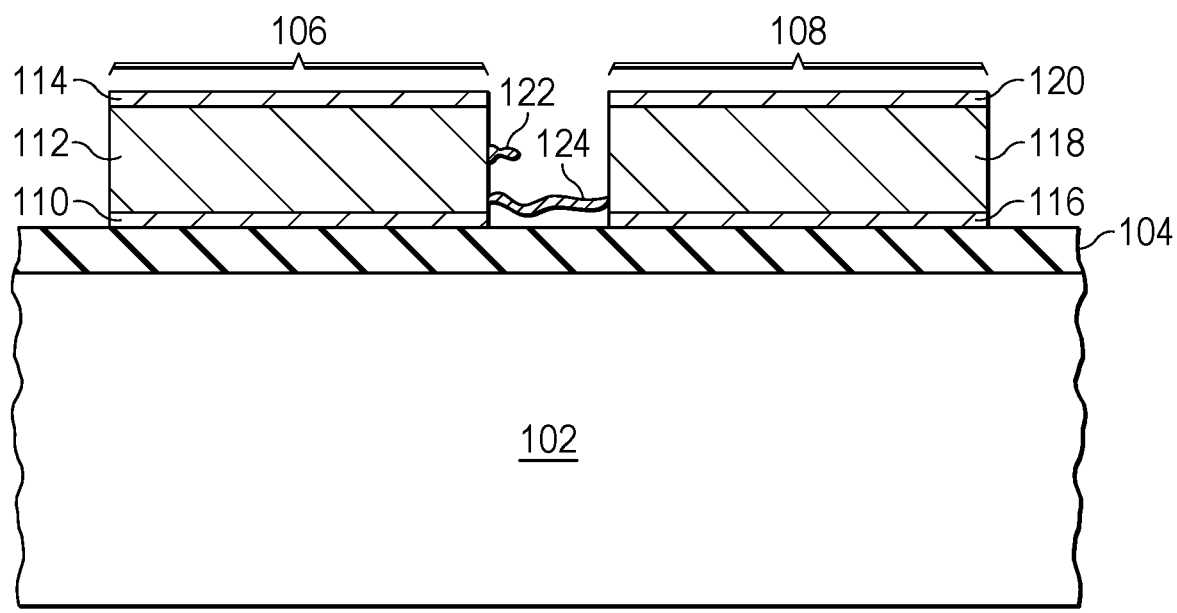
FIG. 1 is a cut-away side view of two leads on a substrate in a partially formed integrated circuit.

In the drawings, corresponding numerals and symbols generally refer to corresponding parts unless otherwise indicated. The drawings are not necessarily drawn to scale.

In this description, the terms "on" and "over" may include layers or other elements where intervening or additional elements are between an element and the element that it is "on" or "over." Unless otherwise stated, the term "about" means a stated value may be within a range of ±10% of the stated value.

Various disclosed methods and devices of the present disclosure may be beneficially applied to integrated circuits that include aluminum-copper metal lines. While such examples may be expected to improve reliability of such circuits, e.g., by reducing the possibility of forming copper precipitates or dendrites between closely spaced lines, no particular result is a requirement of the present invention unless explicitly recited in a particular claim.

FIG. 1 is a cut-away side view of two leads on a substrate in a partially formed integrated circuit 100. In this example, substrate 102 includes a crystalline silicon substrate. In examples, substrate 102 would contain doped regions and isolation structures that form a portion of active devices in an integrated circuit. These have been omitted in FIG. 1 for simplicity. Dielectric layer 104 is formed over the substrate 102. Lead 106 and lead 108 are formed over a surface of dielectric layer 104 opposite to substrate 102. Lead 106 includes first barrier layer 110. Metal layer 112 includes an alloy of aluminum and copper. In this example, metal layer 112 is about 4% copper. A second barrier layer 114 is located over the metal layer 112. Lead 108 includes first barrier layer 116, metal layer 118 and second barrier layer 120. First barrier layer 116 is formed in the same step as first barrier layer 110, in this example, and thus has the same composition. Metal layer 118 is formed in the same step as metal layer 112, in this example, and thus has the same composition as that layer. Second barrier layer 120 is formed in the same step as second barrier layer 114, in this example, and thus has the same composition.

After formation of lead 106 and lead 108, wafers including these leads are often stored in sealed carriers called "foups." The wafers may be stored in the foups for several hours awaiting further processing. During this time, some copper dissolved in the aluminum may come out of solution and precipitate. Because there are no subsequent layers to seal the sides of lead 106 and lead 108 at this stage, the copper precipitate in metal layer 112 and metal layer 118 may form dendrites or tendrils such as tendril 122 and tendril 124. As shown in FIG. 1, tendril 124 spans the gap between leads 106 and lead 108. In this example, tendril 124 may cause a short between lead 106 and lead 108. This may require scrapping of the wafer (or at least the die containing the short). In a worse circumstance, tendril 124 may cause a failure that is not detected until the customer tries to use the device. Thus, reliability requirements necessitate mitigating the formation of copper tendrils.

Figure 2A:
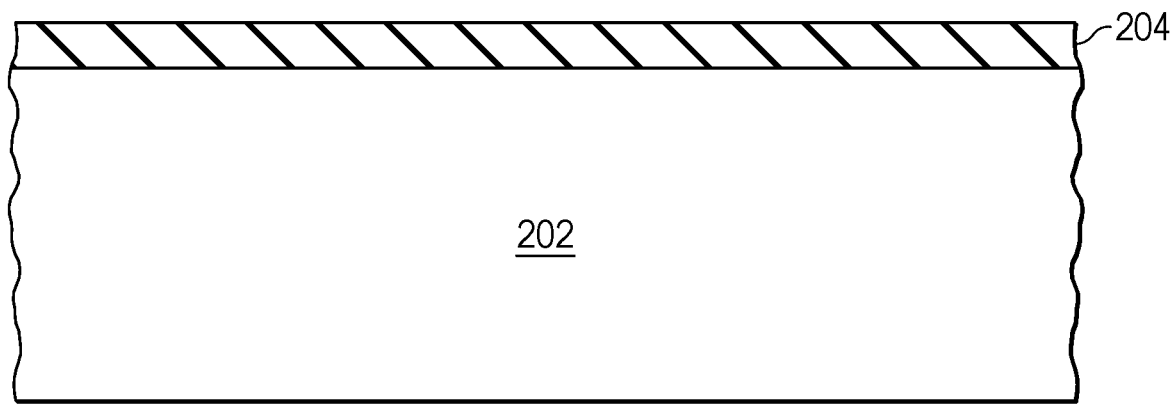
FIGS. 2A-2E (collectively "FIG. 2") are cut-away side views illustrating a process for forming metallization in integrated circuit.
Figure 2B:
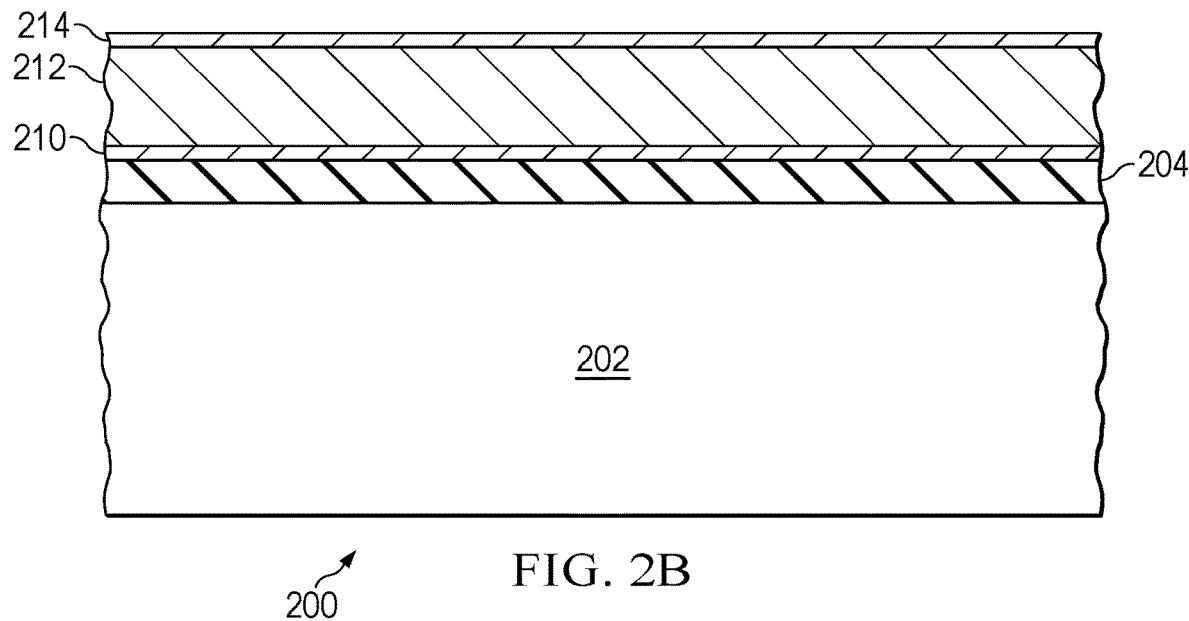

FIGS. 2A-2E (collectively "FIG. 2") are cut-away side views illustrating a process for forming metallization in integrated circuit 200. As shown in FIG. 2A, a dielectric 204 (i.e., an insulating layer or interlevel dielectric layer) is formed by deposition over or oxidation on the surface of semiconductor substrate 202. In this example a layer of silicon dioxide is formed using chemical vapor deposition from a tetra orthosilicate (TEOS) ambient. FIG. 2B shows formation of three subsequent metal layers: first titanium/titanium nitride bilayer 210, aluminum/copper layer 212, and second titanium/titanium nitride bilayer 214. Each of these layers is formed by sputtering, in this example. In this example, a first sputtering of titanium to a thickness of approximately 200 Å followed by a second sputtering of titanium nitride to a thickness of approximately 275 Å forms first titanium/titanium nitride bilayer 210. Also in this example, aluminum with approximately 4% copper is sputtered to a thickness of 4500 Å, forming aluminum/copper layer 212. Also in this example, a titanium is then sputtered to a thickness of approximately 50 Å and titanium nitride is sputtered to a thickness of approximately 300 Å, forming second titanium/titanium nitride bilayer 214.

Figure 2C:
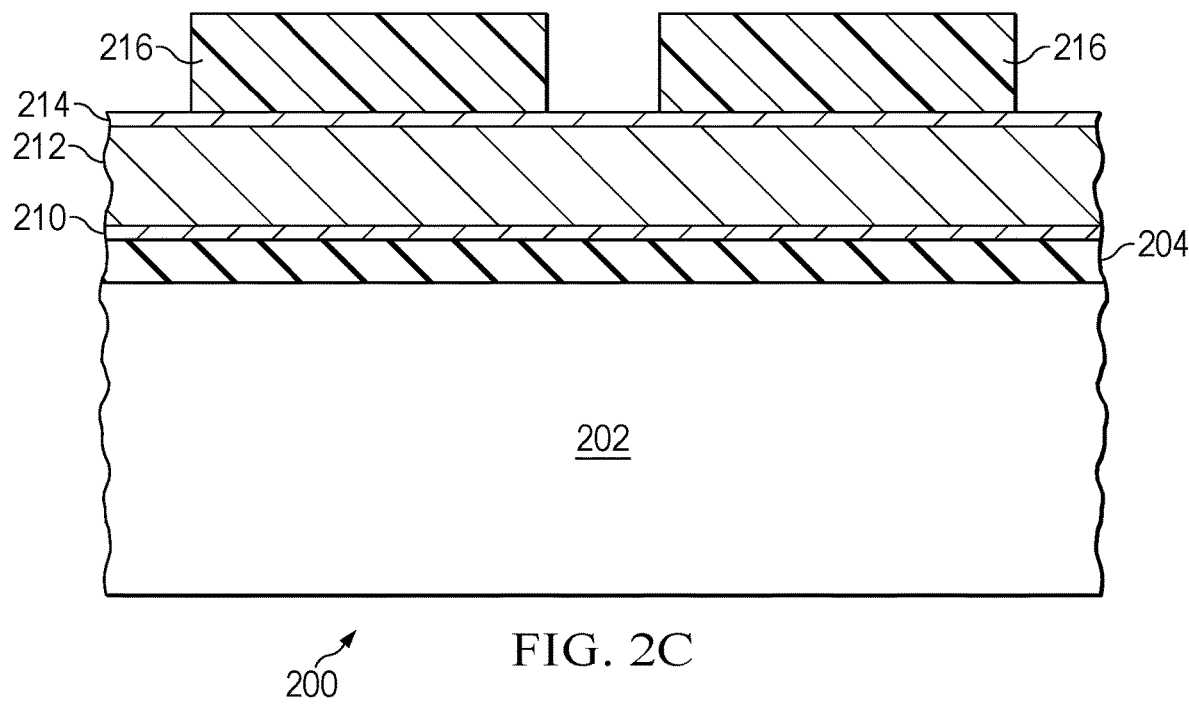
Figure 2D:
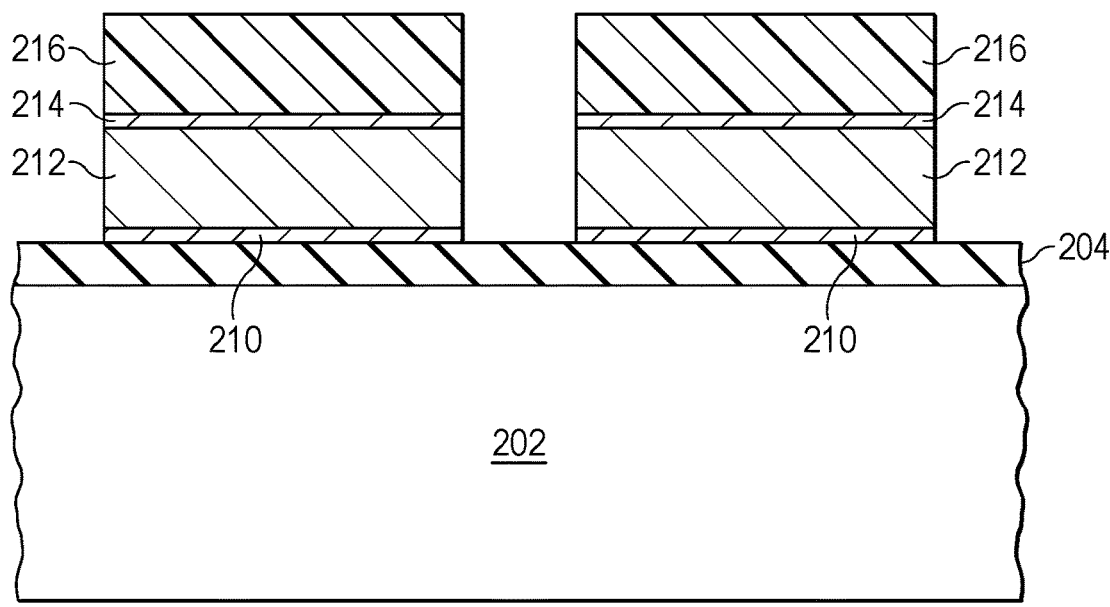
Figure 2E:
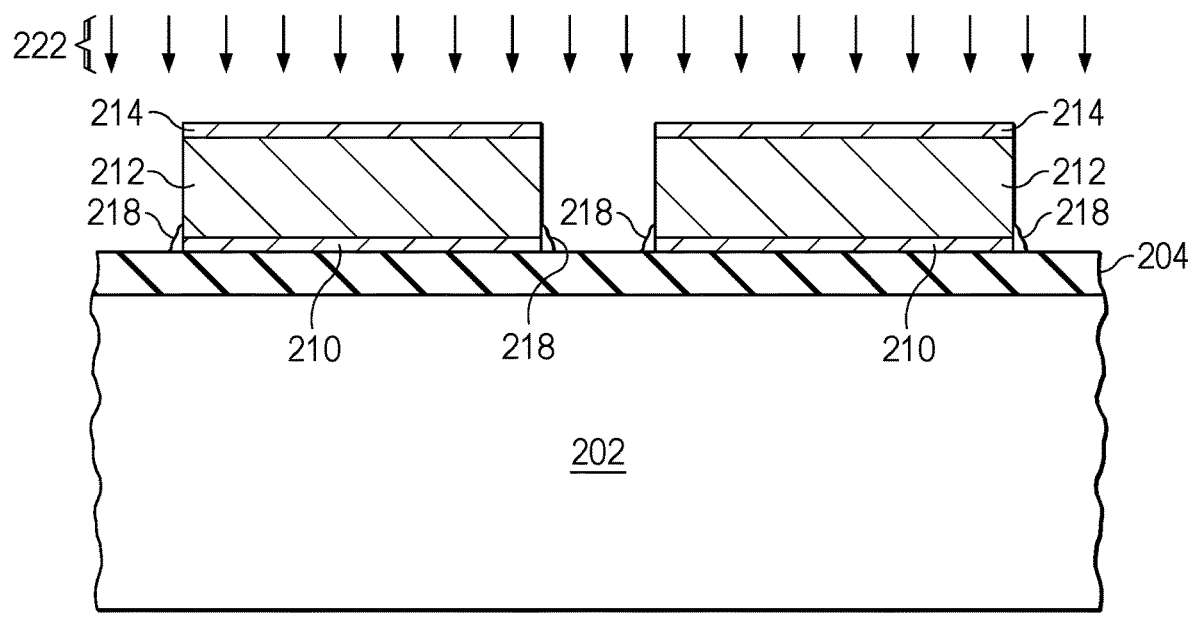

As shown in FIG. 2C, a photoresist layer is formed and patterned to a desired patterned photoresist layer 216 for the combined first titanium/titanium nitride bilayer 210, aluminum/copper layer 212, and second titanium/titanium nitride bilayer 214 on second titanium/titanium nitride bilayer 214. Using patterned photoresist layer 216 as a mask, second titanium/titanium nitride bilayer 214, aluminum/copper layer 212, and first titanium/titanium nitride bilayer 210 are etched using plasma etching to provide a patterned metal layer as shown in FIG. 2D. Dielectric 204 serves as an etch stop. A wet clean removes patterned photoresist layer 216. The cleaning step will leave small remnants 218 of patterned photoresist layer 216 as shown in FIG. 2E. These remnants are removed by ashing 220 at a temperature in a range from 280° C. to 310° C. Of importance, in this example, ashing 222 uses a plasma with a gas flow of oxygen and nitrogen ($O_2/N_2$) where nitrogen is at least 15% of the gas flow. By providing this level of nitrogen in the gas flow, the formation of copper precipitates (tendrils) on the exposed portions of aluminum/copper layer 212 is mitigated. It is believed that nitrogen in the plasma ash process may passivate grain boundaries that intersect the sides of the newly-formed Al—Cu sidewalls, thereby preventing or at least slowing the formation of copper dendrites on the sidewall. Regardless of the precise mechanism, the effectiveness of this process has been demonstrated empirically as described below with regard to FIGS. 3-4.

Figure 3:
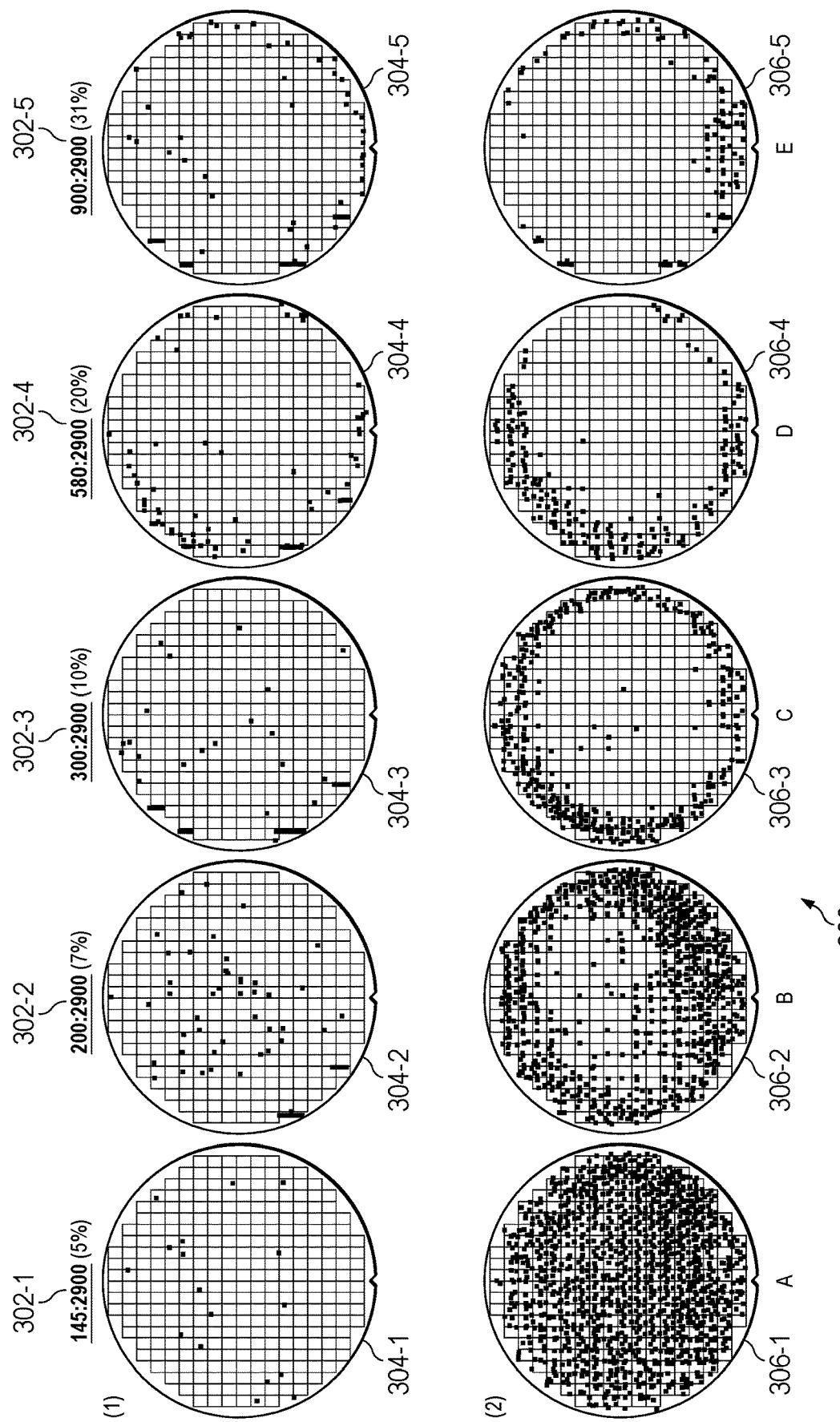
FIG. 3 is a chart showing the effect of increasing the proportion of nitrogen relative to oxygen.

FIG. 3 is a chart 300 showing wafer maps that illustrate the effect of increasing the proportion of nitrogen relative to oxygen in the gas flow during the ashing process in one experimental example. Each of wafer images 304-1 through 304-5 show locations of copper defects (e.g. dendrites) determined by an automated dark field inspection tool immediately after forming Al—Cu metal lines as exemplified by FIG. 2E. Similarly, each of wafer images 306-1 through 306-5 show locations of copper defects determined by an automated inspection tool immediately after the same corresponding wafers were aged for 60 hours in a foup containing the fab ambient. Flow ratios 302-1 through 302-5 show the ratio of $N_2$ in an $N_2$—$O_2$ resist ash process as exemplified by ashing 222 (FIG. 2E). The $O_2$ gas flow for each test was fixed at 2900 standard cubic centimeters per minute (sccm), and the $N_2$ gas flow ranged from 145 sccm (5%) to 900 sccm (31%). In these examples, the total gas flow ($N_2$ plus $O_2$) increases from 3045 sccm to 3800 sccm as the nitrogen flow rate increases. The corresponding $N_2/O_2$ concentration ratios range from about 4.7% to about 23%. In these examples, the wafers are heated to a range of 280° C. to 310° C. and the plasma is energized by a microwave source at about 2.5 kW during the ashing. The process chamber pressure is approximately 750 mTorr.

A dark field inspection tool differs from a bright field inspection tool in that the dark field light is directed at the wafer at an angle where only scattered light, and not reflected light is detected. Typically, the light used has a wavelength or 200 nm or less. This type of measurement tool provides better results for detecting copper precipitates than, e.g. a bright field inspection. While sixty hours is longer than wafer typically rest prior to a subsequent dielectric deposition, this value was chosen for this experiment to show the different effects of the different gas compositions more clearly.

Wafer maps 304-1 through 304-5 show a modest number of defects relatively homogenously distributed across each wafer map, with some preference for defects at the edge of the wafer maps ("edge defects"). In marked contrast the wafer map 306-1 (5% $N_2$) shows a large number of relatively homogenously distributed defects. As the $N_2$ concentration increases to 31%, the defect density decreases, and the defects that are detected are predominantly located at the wafer edge. The decrease in center defectivity from 7% to 10% is particularly sharp, with only a few defect remaining outside a ring concentrated at the wafer edge. This surprising result was unexpected, and likely demonstrates a heretofore unrecognized critical $N_2$ concentration of about 9-10% that substantially passivates grain boundaries in the Al—Cu sidewall from which the dendrites are thought to originate, or otherwise prevent nucleation of the dendrites.

Figure 4:
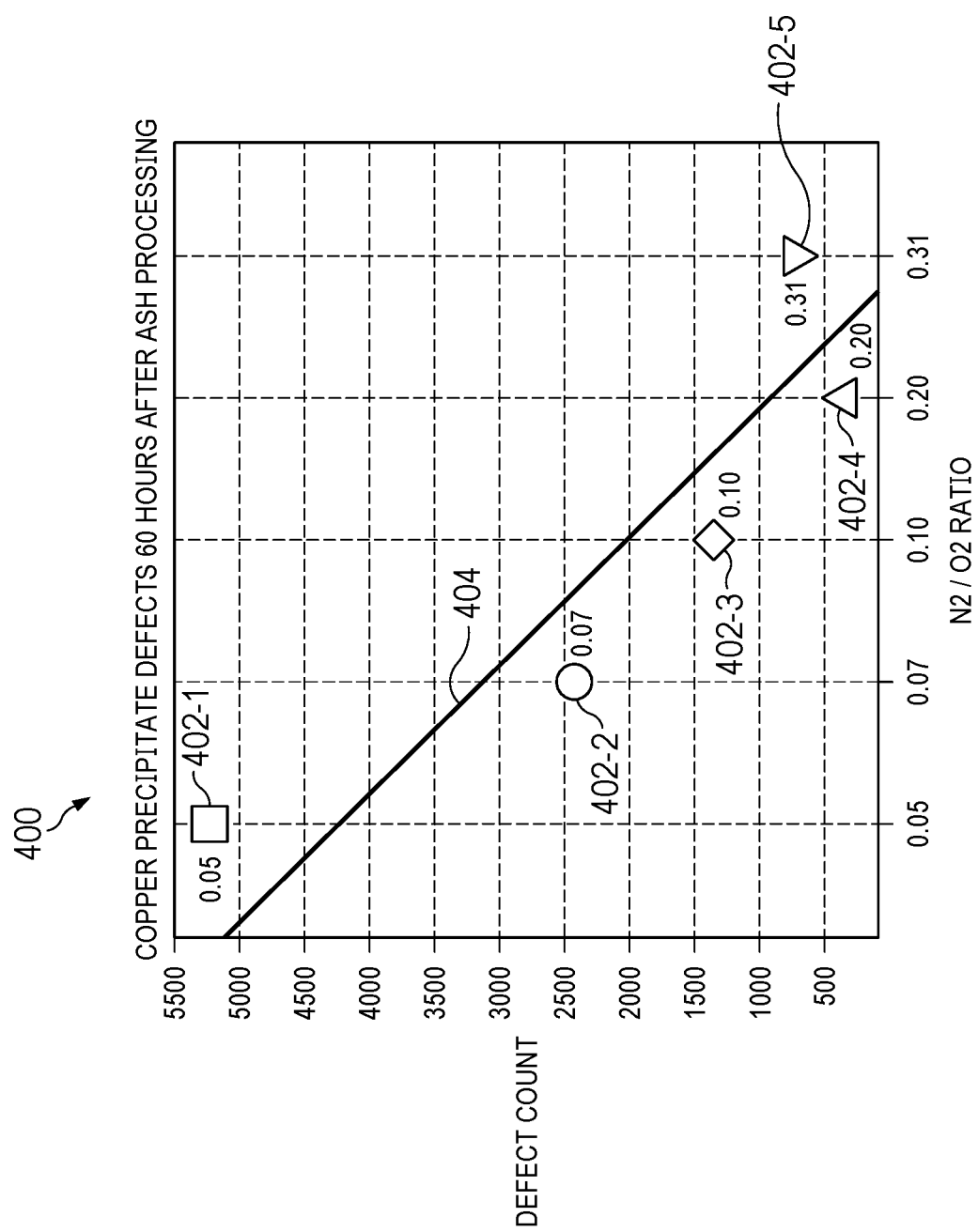
FIG. 4 is a graph of experimental results.

FIG. 4 is a graph 400 of defect count vs. $O_2$—$N_2$ flow ratio for wafers processed similarly to those shown in FIG. 3. The vertical axis of graph 400 is the defect counts per wafer for wafers stored in the foup for sixty hours. The horizontal axis of graph 400 is the flow ratio of nitrogen to oxygen used in the ashing process. Data point 402-1 shows that an $N_2$—$O_2$ flow ratio of 0.05 (5%) produced more than 5,000 defects per wafer. Data point 402-2 shows that an $N_2$—$O_2$ flow ratio of 0.07 (7%) produced approximately 2,400 defects per wafer. Data point 402-3 shows that an $N_2$—$O_2$ flow ratio of 0.10 (10%) produced approximately 1,300 defects per wafer. Data point 402-4 shows that an $N_2$—$O_2$ flow ratio of 0.20 (20%) produced approximately 300 defects per wafer. Data point 402-5 shows that an $N_2$—$O_2$ flow ratio of 0.31 (31%) produced approximately 600 defects per wafer. Line 404 shows a least-squares regression line of data points 402-1 through 402-5. The data shows that data points 402-4 and 402-5 provide significantly fewer defects. Of note, data point 402-4 includes a nitrogen flow rate of 580 sccm and an oxygen flow rate of 2900 sccm and data point 402-5 includes a nitrogen flow rate of 900 sccm and an oxygen flow rate of 2900 sccm. While the wafer map 306-3 demonstrates a significant reduction of wafer defects in the central region of the wafer at a flow ratio of only 10%, the numerical data of graph 400 shows a further significant reduction of defect counts at the wafer edge as the percentage of nitrogen in the $N_2$—$O_2$ gas flow increases to 15% or more, corresponding to an $N_2$ plus $O_2$ gas flow of about 3300 sccm or more. Clearly beneficial improvement results at and above a flow ratio of 20% or an $N_2/O_2$ concentration ratio of 17%, at least at the example gas flow rates.

Modifications are possible in the described examples, and other examples are possible, within the scope of the claims.

What is claimed is:
1. A method for forming an integrated circuit comprising:
   depositing a metal layer including aluminum and copper over a semiconductor substrate;
   forming a patterned photoresist layer over the metal layer;

etching the metal layer to produce a patterned metal layer; and ashing the patterned photoresist layer in a plasma provided in a process chamber sourced with and a gas flow including 900 sccm $N_2$ and 2900 sccm $O_2$.

2. The method of claim 1, further comprising forming an interlevel dielectric layer over the semiconductor substrate before depositing the metal layer.

3. The method of claim 1, wherein the metal layer includes at least 2% copper.

4. The method of claim 1, wherein the metal layer includes about 4% copper.

5. The method of claim 1, wherein the metal layer is between and touching a first barrier layer and a second barrier layer.

6. The method of claim 1, wherein the semiconductor substrate is in a range from 280° C. and 310° C. during the ashing.

7. The method of claim 1, wherein the plasma is energized by a microwave source at about 2.5 kW.

8. The method of claim 1, wherein etching the metal layer produces a plurality of metal lines, and the ashing at least partially passivates grain boundaries at sides of the metal lines.

9. A method for forming an integrated circuit comprising:

depositing a metal layer including aluminum and copper over a semiconductor substrate;

depositing a barrier layer on the metal layer;

forming a photoresist layer on the barrier layer;

exposing the photoresist layer to light conforming to a pattern of the barrier layer and the metal layer;

removing portions of the photoresist layer on the barrier layer corresponding to where the barrier layer and the metal layer are to be removed;

etching the barrier layer and the metal layer to provide a pattern of metal lines; and ashing the photoresist layer in a plasma provided in a process chamber sourced with a gas flow having $N_2$ and $O_2$, wherein during the ashing an $N_2$ plus $O_2$ flow rate is about 3800 sccm and an $N_2/O_2$ concentration ratio is about 23%.

10. The method of claim 9, wherein the barrier layer includes titanium and titanium nitride.

11. The method of claim 9, wherein the metal lines includes 4% copper.

12. The method of claim 9, wherein the ashing removes a remnant of the photoresist layer.

13. The method of claim 9, wherein the ashing at least partially passivates grain boundaries at sides of the metal lines.

* * * * *